(12) United States Patent
Kim et al.

(10) Patent No.: US 6,838,897 B2
(45) Date of Patent: Jan. 4, 2005

(54) INTEGRATED CIRCUIT TEST SYSTEM AND METHOD

(75) Inventors: Yoon-Min Kim, Suwon (KR); Ki-Yeul Kim, Osan (KR); Jae-Hoon Cha, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/691,258

(22) Filed: Oct. 22, 2003

(65) Prior Publication Data

US 2004/0080311 A1 Apr. 29, 2004

(30) Foreign Application Priority Data

Oct. 28, 2002 (KR) .................................. 10-02-00065723

(51) Int. Cl.[7] .............................................. G01R 31/02
(52) U.S. Cl. ..................... 324/760; 324/765; 324/158.1
(58) Field of Search ................. 324/760, 765, 324/754, 158.1, 72.5; 209/573; 165/80.1, 80.2, 80.3, 80.4; 219/209

(56) References Cited

U.S. PATENT DOCUMENTS 4,782,291 A * 11/1988 Blandin ................... 324/158.1
5,166,606 A * 11/1992 Blanz ......................... 324/760

* cited by examiner

Primary Examiner—Michael Tokar
Assistant Examiner—Jimmy Nguyen
(74) Attorney, Agent, or Firm—Mills & Onello LLP

(57) ABSTRACT

The integrated circuit teat system and method prevent the occurrence of frost under a very low temperature environment during the exchange of integrated circuits under environmental testing and allows for the continuous testing thereof. The integrated circuit test system comprises a test chamber, a portion of which is adapted to interface with a tester having a circuit panel. An auxiliary chamber is adjacent the test chamber, the auxiliary chamber including a first door between the auxiliary chamber and the test chamber, the auxiliary chamber further including a second door between the auxiliary chamber and an external region, the auxiliary chamber for receiving a sample prior to and following a test. A transfer unit is also in the chamber, for transferring the sample between the test chamber and the auxiliary chamber through the first door. Accordingly, the time consumed during the exchange of testing samples is shortened. In addition the sample and respective test system components are prevented from being damaged by maintaining a low moisture environment.

5 Claims, 4 Drawing Sheets

INTEGRATED CIRCUIT TEST SYSTEM AND METHOD

BACKGROUND OF THE INVENTION

1. Field of the Invention

The present invention relates to an integrated circuit test system and method, in order to enable the continuous exchange of numerous integrated circuits and a test work, while preventing the occurrence of frost in a very low temperature environment.

2. Description of the Related Art

As circuit density continues to increase, the testing of Soc (System On a Chip) products becomes ever more important. Such testing is provided to determine whether electrical characteristics of the products operate normally, while the operating environment varies. For example, the circuit under test can be subject to an HVS (High Voltage Stress) test based on a gradually varied use range of the products and subject to an extreme environment test, e.g., of high temperature, low temperature and very low temperature. Especially, in the test involving the ranging temperature environment, varying between a high temperature and a very low temperature, the test ensures the practical use of the product.

Testing under a low temperature and a very low temperature atmosphere is more difficult than testing under a high temperature atmosphere. In forming the low and very low temperature atmosphere, moisture that is present in the ambient air is condensed into a solid state and then is formed as frost, on an excessively cooled sample and on portions of respective components electrically connected to the sample. This causes a leakage current, and a repeated shrinkage and expansion of the condensed moisture causes potential damage and breakage of the sample and the respective components.

A conventional integrated circuit test system and method under a low or very low temperature environment is now described as follows, with reference to the accompanying drawings.

With reference to FIGS. 1 and 2, the conventional integrated circuit test system includes a tester 10 having a plurality of channel cards 12 for executing an electric characteristic test of an integrated circuit (IC); a test board 20, which is referred to as a wiring board or a performance board, and which is electrically connected to the tester 10 containing the channel cards 12 and is equipped with various circuit components 22 necessary for a test of the IC; and a temperature controller 30 positioned on one side of the tester 10, for generating air as a desired temperature level and providing the IC mounted on the test board 20 with the temperature-controlled air.

The tester 10 includes a test head part 14 equipped on a portion thereof, which executes a test using the plurality of channel cards 12.

The test head part 14 includes a mounting member 14a on an upper face circumference thereof the mounting member 14a electrically connecting the test board 20 with channel terminals 12a of the channel cards 12.

The tester 10 is provided with a manipulator 16 on another portion thereof, the manipulator 16 controlling the progression of a test by a worker; an output part 18 such as a monitor etc. for checking status of the progression; and a computation part or a computer etc. (omitted for a brevity of the drawings), for managing and executing computations related to testing.

The test board 20 mounted through the mounting member 14a of the tester 10 includes a socket 24 for receiving an IC via an electrical connection; various circuit components 22 necessary for the test of the IC; and a circuit pattern (omitted for the brevity of the drawings) having an electrical connection with the channel terminals 12a of the channel cards 12.

The various circuit components 22 can be provided as active elements such as a resistor, a condenser and an inductor, and as switching devices such as a relay, so as to prevent a drop of characteristic caused by noise generated in a test procedure of the IC. These circuit components 22 are installed, preferably, approximately near the socket 24, via soldering.

The temperature controller 30 equipped on one side of the tester 10 includes an air forming part 32 for eliminating moisture present in the ambient air and simultaneously generating air at the desired low temperature level. The air at a low temperature and moisture formed in the air forming part 32 flows through a supply line 34 that is extended to a position face to face with the IC mounted to the test board 20.

The supply line 34 is provided with a supply nozzle 36 on an end part thereof, which is positioned to rise and set against the IC mounted to the test board 20, and for selectively supplying air at the low temperature and moisture.

The supply nozzle 36 is equipped with a guide pipe 38 that is, partially or entirely, made of transparent material and that surrounds around an end outer portion of the supply nozzle 36 in a pipe shape.

The guide pipe 38 controls air supplied through the supply nozzle 36 to be distributed restrictedly within the IC and nearby to its perimeter.

In addition, a withdrawal line 40 is connected to an upper part side of the guide pipe 38, to withdraw and return the supplied air of low temperature/moisture to the air forming part 32.

Operations of the respective components will now be described as follows.

A sampling IC is mounted on the test board 20, and then the temperature controller 30 positions the supply nozzle 36 over the IC. At this time, the guide pipe 38 is positioned close to the test board 20 as shown.

Then, the temperature controller 30 maintains a low moisture state on the IC and its peripheral region, and continuously supplies air at a low temperature, to thereby cool the IC to the desired temperature level. The supplied air of low temperature and moisture is distributed limitedly to the area range of the guide pipe 38. This air is partially re-circulated through the withdrawal line 40, and the remaining air is externally discharged through a gap between the guide pipe 38 and the test board 20.

When the IC is cooled to the desired level through such a procedure, a worker executes a test procedure using the test board 20 electrically connected to the IC and using the channel cards 12 in the tester 10.

As described above, in the midst of the test procedure, air present under the test board 20 is condensed into a solid state, namely, formed as frost, due to the excessive cooling atmosphere, on the test board 20 and on the various circuit components 22. Such frost has a continuous crystal growth, and thus causes a failure such as a leakage current on the respective components having an electrical connection. Furthermore, the leakage current commonly occurs simultaneous with the start of the test under a very low temperature atmosphere of about −90° C., etc., which is a serious limitation.

According to a conventional technology to address this problem, a sealing member 26 having a shield plate 26a is mounted to a rear portion of the cooled test board 20 for cutting off the invasion of moisture. Also, on the test board 20, a through-hole 28 is formed so as to supply air of low temperature/moisture to a lower side of the test board 20 provided by the installation of the sealing member 26.

But, separately from such above-mentioned conventional technology to solve the problems, during the exchange of an IC that has completed the test, the excessively cooled sample is exposed to air, and frost is generated on the sample and respective components of the tester 10, containing the socket 24 and the test board 20 electrically connected to the sample, which can lead to a failure. In particular, the sample and components can be damaged and cracked by the physical force of shrinkage and expansion due to frost.

To solve these problems, the sample and the respective excessively cooled components must be again slowly returned to a normal temperature state, and the sample must again slowly be cooled so as to maintain low moisture after the exchange of the samples. These required procedures cause an inconvenience, require an excessively long time to progress. Furthermore, this shortens the useful life of the test board 20 and the respective components influenced by frost, to thus, again, affect the economy of manufacturing.

SUMMARY OF THE INVENTION

It is therefore an object of the present invention to provide an integrated circuit test system and method to prevent samples from being influenced by frost in a very low temperature environment, to shorten the exchange time of samples for a test through a continuous exchange, and protect the sample and respective components electrically connected to the sample from damage.

To achieve these objects, according to one aspect of the present invention, the integrated circuit test system comprises a test chamber, a portion of which is adapted to interface with a tester having a circuit panel. An auxiliary chamber is adjacent the test chamber, the auxiliary chamber including a first door between the auxiliary chamber and the test chamber, the auxiliary chamber further including a second door between the auxiliary chamber and an external region, the auxiliary chamber for receiving a sample prior to and following a test. A transfer unit is also in the chamber, for transferring the sample between the test chamber and the auxiliary chamber through the first door.

The transfer unit may comprise gloves inserted into a wall of the test chamber to allow for manual manipulation of the sample between the test chamber and the auxiliary chamber. Optionally, the transfer unit comprises a transfer robot installed in the chamber, for transferring the sample between the test chamber and the auxiliary chamber in response to an applied control signal.

The test chamber may further include a check valve on a wall thereof for discharging air from the test chamber interior to an external region. The test chamber further optionally comprises a region that allows for the lowering and raising of a supply nozzle to and from the circuit panel. The test chamber may further include a hole through which the supply nozzle is positioned, and, optionally, an elastic pipe between the hole and a portion of the supply nozzle positioned within the chamber, said elastic pipe elastically deforming with movement in the supply nozzle, and maintaining a seal of the test chamber.

In addition, the chamber is preferably made at least partially of a transparent material to allow for external observation of a test conducted therein.

In another aspect, the present invention, is directed to a method for testing an integrated circuit using a system that includes a test chamber, a portion of which is adapted to interface with a tester having a circuit panel, an auxiliary chamber adjacent the test chamber, the auxiliary chamber including a first door between the auxiliary chamber and the test chamber, the auxiliary chamber further including a second door between the auxiliary chamber and an external region, the auxiliary chamber for receiving a sample prior to and following a test; and a transfer unit in the chamber, for transferring the sample between the test chamber and the auxiliary chamber through the first door. The method comprises opening the second door for introducing at least one sample in the auxiliary chamber. The second door is then closed and the first door opened so as to mount the sample on the test board using the transfer unit. The supply nozzle is positioned over the sample and the sample is cooled with air of a suitable temperature and moisture level. An electrical test is then conducted. At the completion of the electrical test, the supply nozzle is removed from the sample, the first door is opened, and the tested sample is transferred to the auxiliary chamber. The first door is then closed.

Following transfer of the tested sample to the auxiliary chamber and prior to closing the first door, a second sample located in the auxiliary chamber is mounted on the test board.

The air of a suitable temperature and moisture level supplied by the supply nozzle is preferably supplied to maintain pressure of the test chamber interior at a level higher than the pressure external to the second door.

The test chamber further optionally includes a check valve on a wall thereof for discharging air from the test chamber interior to an external region, to maintain the pressure of the test chamber interior at a selected level. The air has, for example, a temperature range of −150~−40° C.

BRIEF DESCRIPTION OF THE DRAWINGS

The above and other objects and features of the present invention will become apparent from the following description of preferred embodiments thereof made in conjunction with the accompanying drawings, of which.

DETAILED DESCRIPTION OF PREFERRED EMBODIMENTS

Hereinafter, preferred embodiments of the present invention for integrated circuit test system and method will be described in detail with reference to FIGS. 3 and 4.

Figure 1:
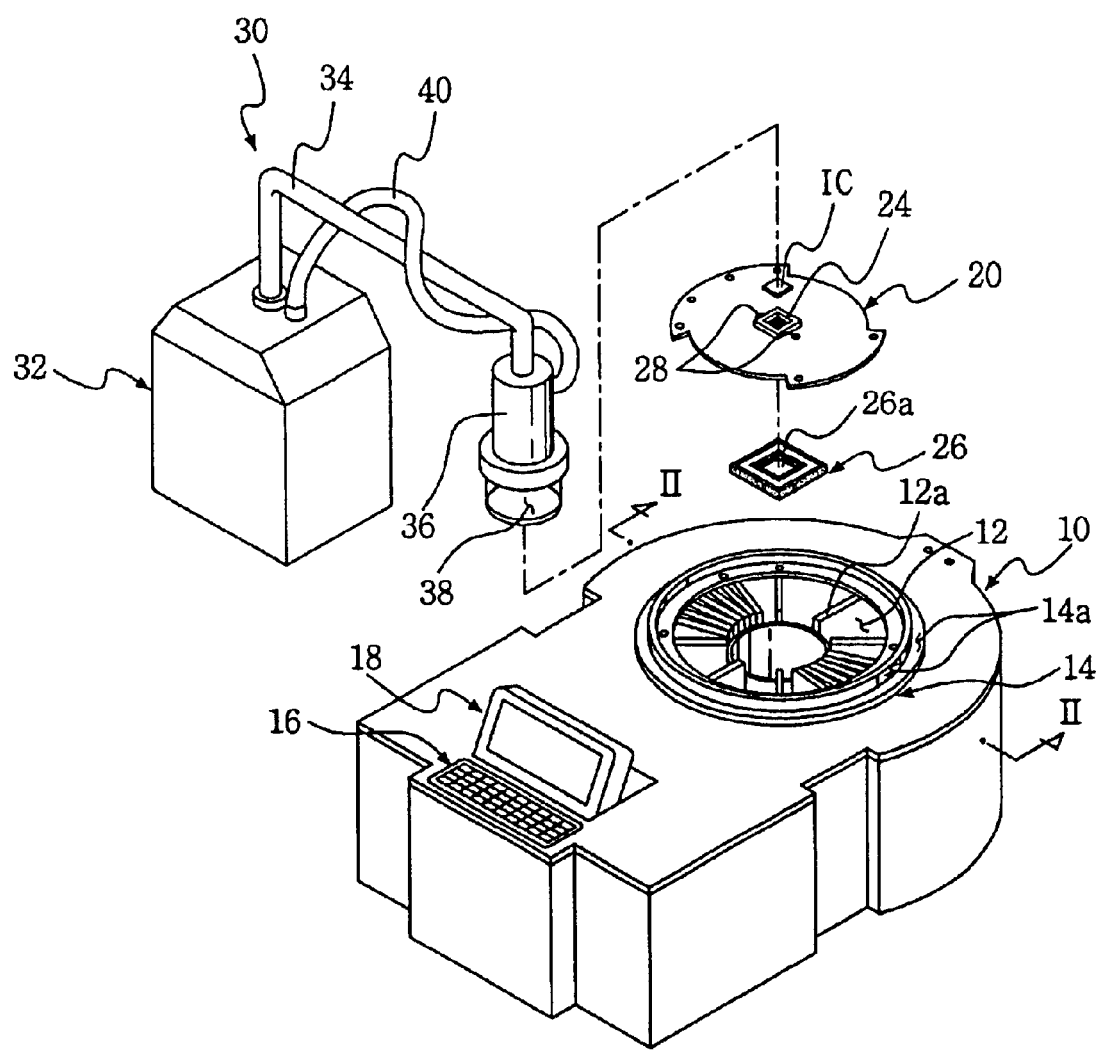
FIG. 1 is a fragmentary perspective view of a conventional integrated circuit test system.
Figure 2:
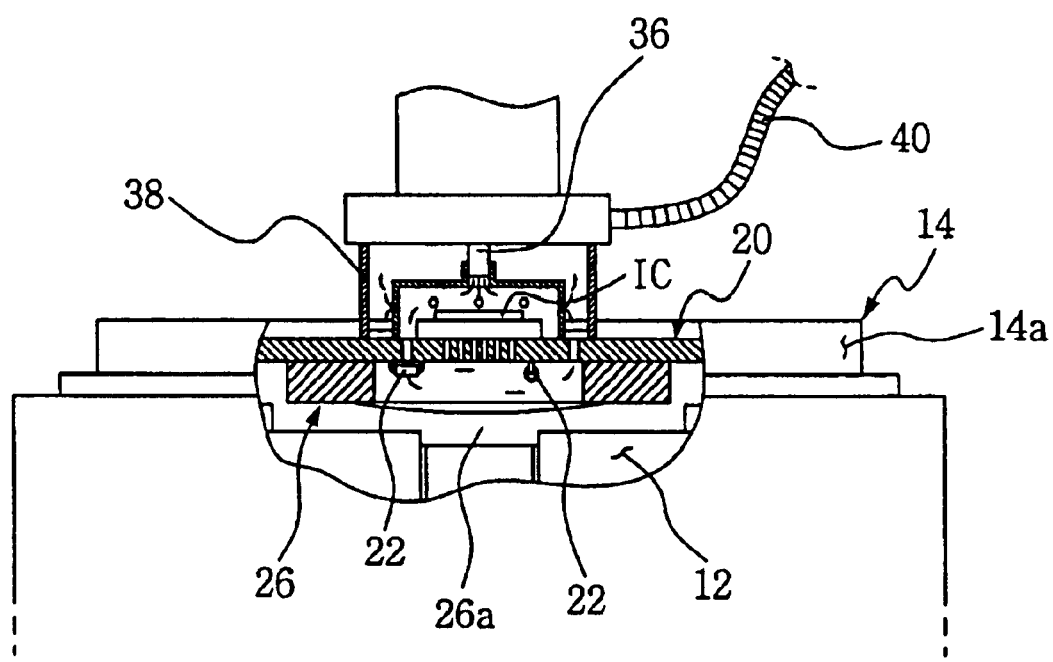
FIG. 2 is a sectional view showing an assembly and operational concern of components taken along II—II of FIG. 1.
Figure 3:
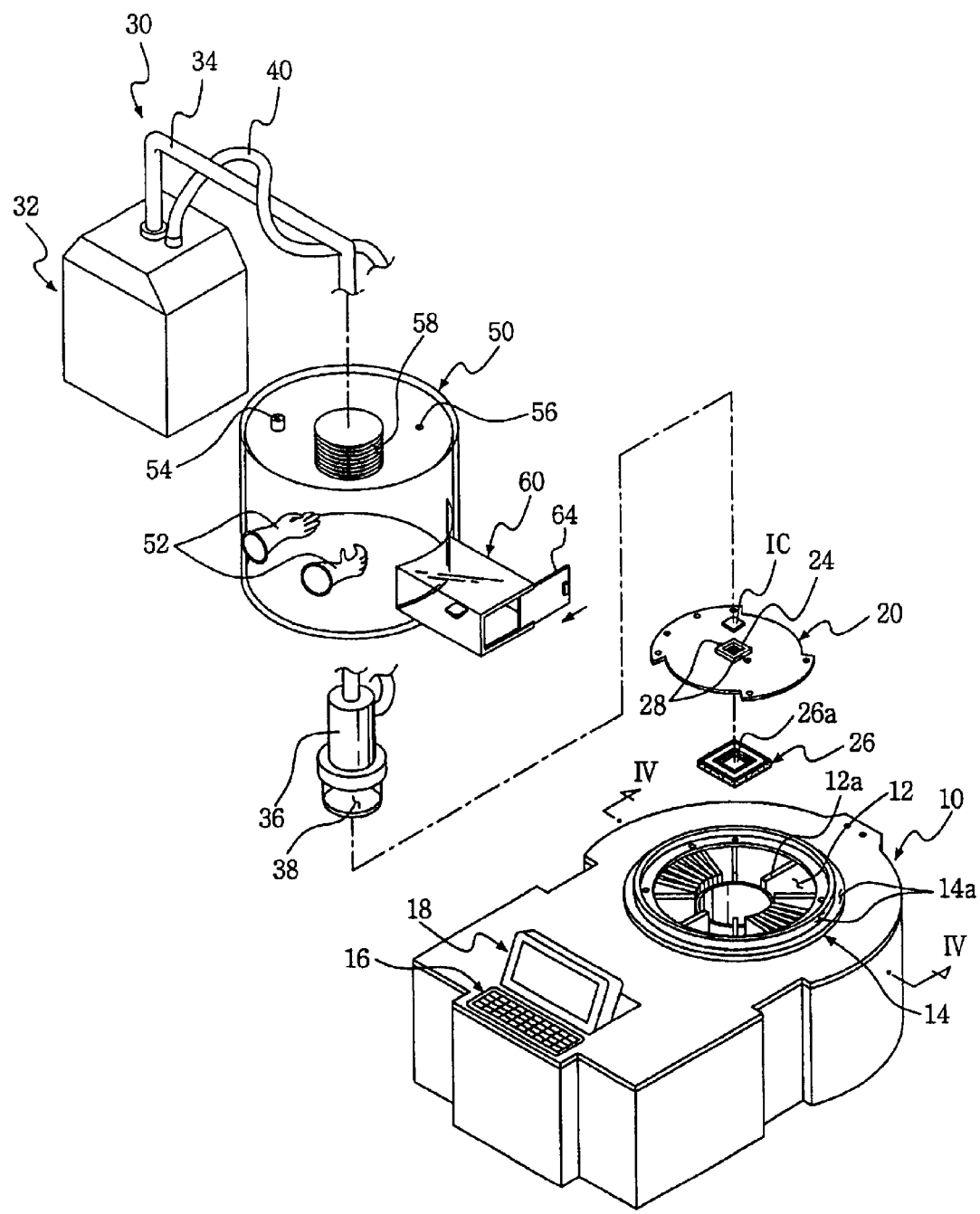
FIG. 3 is a fragmentary perspective view of an integrated circuit test system in accordance with an exemplary embodiment of the present invention.

FIG. 3 is a fragmentary perspective view of an integrated circuit test system in accordance with one embodiment of the present invention. FIG. 4 is a sectional view showing an assembly and operational relation of components taken along IV—IV of FIG. 3. Certain primary components of the present invention are the same as those described with respect to the integrated circuit test system of FIGS. 1 and 2, and therefore, a detailed description thereof will be omitted for the sake of brevity.

Figure 4:
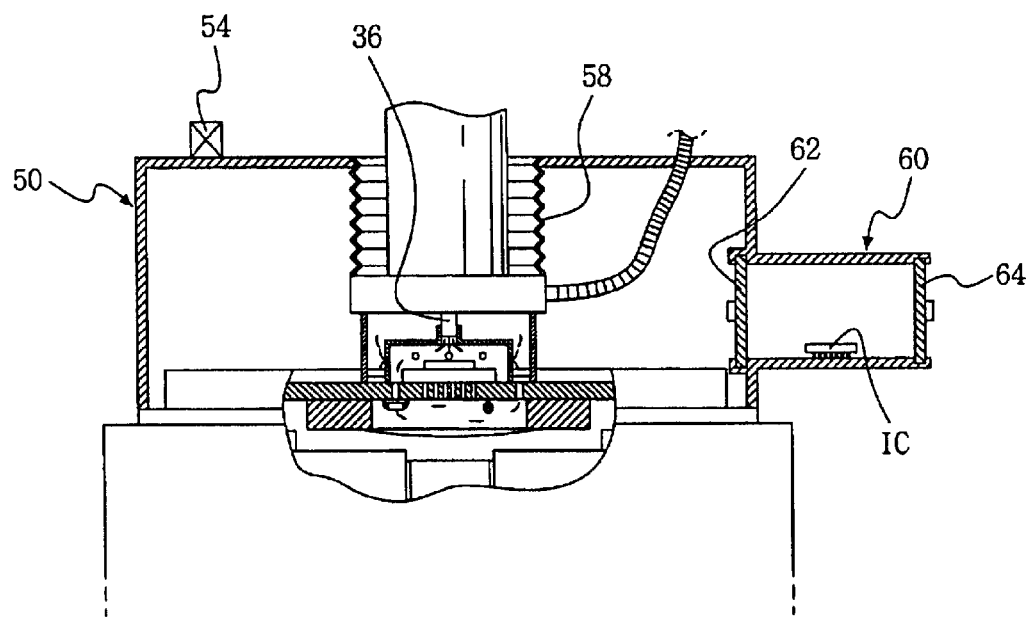
FIG. 4 is a sectional view showing an assembly and operational concern of components taken along IV—IV of FIG. 3.

Referring first to FIGS. 3 and 4, the integrated circuit test system includes a tester 10 having a plurality of channel cards 12 for testing electrical characteristics of a sample such as an integrated circuit (IC) etc., the tester 10 being for performing a test; a test board 20, for example referred to as a wiring board or a performance board, which is electrically connected to an upper part of the tester 10 including the channel cards 12, and which includes various types of circuit components 22 necessary for the test of the IC; and a temperature controller 30 positioned on one side of the tester 10, for forming a test environment at a desired temperature level and providing such a temperature level to the IC mounted on the test board 20.

The tester 10 has a test head part 14 in which the test is performed using the plurality of channel cards 12 on a given portion thereof. The test head part 14 has a mounting member 14a for electrically connecting the test board 20 with channel terminals 12a of the channel cards 12 on an upper face circumference thereof.

On another constant portion of the tester 10, provided are general devices, namely, a manipulator 16 for controlling a test operation through a worker, an output part 18 such as a monitor etc. for checking test progression status, and a computation part or a computer (omitted for a brevity of the drawings) for performing a computation operation of various kinds of information based on the progression of the test.

The test board 20 mounted through the mounting member 14a of the tester 10 includes a socket 24 for electrical connection with the IC; and a circuit pattern (not shown for a brevity of the drawings) having a mutually electrical connection with various kinds of circuit components 22 and the channel terminals 12a of the channel cards 12, the circuit components 22 being necessary for the test of the IC mounted through the socket 24.

The various kinds of circuit components 22 can be provided as active devices such as a resistor, a condenser and an inductor, and also provided as switching devices such as a relay, so as to prevent a characteristic of the IC from being dropped by noise occurring in the test procedure of the IC. The circuit components 22 are preferably installed, for example soldered, proximal to the portion where the socket 24 is installed.

The temperature controller 30 provided on one side of the tester 10 includes an air forming part 32 for eliminating moisture contained in the air and simultaneously forming air at a desired low temperature and a desired moisture level; and a supply line 34, which is extended so as to be face to face with the IC put on the test board 20, and is provided as a supply path of air of low temperature/moisture formed by the air forming part 32.

The supply line 34 is provided with a supply nozzle 36 positioned on an end part thereof, the supply nozzle 36 rising and falling against the IC put on the test board 20 and being for selectively supplying air at the desired temperature and moisture levels.

The supply nozzle 36 is provided with a guide pipe 38 that surrounds around an end outer portion of the supply nozzle 36, as an appropriate shape of pipe made of transparent material.

The guide pipe 38 restricts air to be distributed to within a desired perimeter of the IC including the IC, the air being supplied through the supply nozzle 36. Further, the guide pipe 38 is connected to a withdrawal line 40 for withdrawing the supplied air at the desired low temperature and moisture from the test board 20 and recirculating the air to the air forming part 32.

On an upper part of the tester 10, a chamber 50 is installed that encompasses a region of the test board 20 and the rising/falling moving region of the supply nozzle 36. Herewith, a lower part of the chamber 50 adheres closely onto the tester 10, for example the chassis of the tester, or, as shown in FIG. 3, adheres closely to a circumferential portion of the mounting member 14a, maintaining airtightness through the use of a general sealing member (not shown for the sake of a brevity of the drawing).

In an upper part of the chamber 50, a hole is formed, through which the supply nozzle 36, rises and falls. This hole is connected with a circumferential part of the supply nozzle 36 (herein, is connected with an upper part of the guide pipe 38 rising and falling dependently upon the supply nozzle) via an elastic pipe 58 or bellows. The elastic pipe 58 is equipped to separate, with maintenance of airtightness, the interior of the chamber 50 from the outside.

The elastic pipe 58 allows the supply nozzle 36 including the guide pipe 38 to freely rise and fall, against the fixed-installed chamber 50, and simultaneously prevents inflow and outflow of external air corresponding to the rising and falling drive of the supply nozzle 36. The elastic pipe 58 has elasticity in the rising and falling drive direction of the supply nozzle 36 against the hole formed on the chamber 50.

To reduce, as possible, the region range of the chamber 50, instead of the construction of the elastic pipe 58, the region of the chamber 50 can be manufactured and formed to be of a size commensurate with all ranges of a positional movement of respective components, including the supply nozzle 36 to the air forming part 32.

The chamber 50 is provided with and is adjacent to an auxiliary chamber 60 on one side thereof, the auxiliary chamber 60 of a predetermined size or volume. Between the chamber 50 and the auxiliary chamber 60, installed is a first door 62 that is opened and closed, for example, from an inner side of the chamber 50, the first door 62 connecting the chamber 50 and the auxiliary chamber 60.

On one outer side portion of the auxiliary chamber 60, a second door 64 is provided to be opened and closed to enter a sample into the interior of the auxiliary chamber 60 from an external source, or to remove the sample from the auxiliary chamber 60.

In the chamber 50, equipped is a transfer part for transferring the sample between the test board 20 and the auxiliary chamber 60. As shown in FIG. 3, the transfer part may be constructed of gloves 52 inserted at a sidewall portion of the chamber 50 in an inner side direction thereof, or can be constructed of a general transfer robot (not shown for the sake of a brevity of the drawing) installed in the chamber 50, to selectively transfer the sample between the test board 20 and the auxiliary chamber 60 in response to a control signal applied from a controller (not shown for the brevity of the drawing).

Further, on a sidewall of the chamber 50, a check valve 54 is further installed to allow an outflow of air from the chamber 50 to the outside and to prevent an inflow of air from the outside to the chamber 50.

On another sidewall of the chamber 50, equipped is a withdrawal line 40 for withdrawing a constant amount of air of low temperature/moisture supplied by the supply nozzle 36, and returning it to the air forming part 32.

The withdrawal line 40 pierces through an installation hole 56, maintaining airtightness. The withdrawal line 40 is preferably made of flexible material so as to correspond to the rising and falling drive of the supply nozzle 36.

Meanwhile, if the transfer part is provided as the gloves 52, the chamber 50 is preferably manufactured using a transparent material so that a worker can visually determine the status of the interior. If constructed of the transfer robot, a side constant portion of the chamber 50 is preferably manufactured of transparent material so that the worker may visually determine the interior progression status.

Operations of the respective components are described as follows.

First, a worker enters a testing sample, namely, the IC, in the auxiliary chamber 60 through an opening of the second door 64, and then the second door 64 is closed. Next, the worker places his/her hands in the transfer part, namely, in the gloves 52 arranged in the sidewall of the chamber 50, to thus open the first door 62 and then mount the sample that was put in the auxiliary chamber on the test board 20. Subsequently, the supply nozzle 36 is dropped so as to position the sample within the region of the guide pipe 38. Next, the air forming part 32 supplies air at the desired low temperature and desired moisture to the sample through the supply line 34 and the supply nozzle 36, to thus cool the sample.

When the sample is cooled to the desired level, an electrical characteristic test is executed through the tester 10. When this procedure is completed, the supply nozzle 36 rises upward so as to expose the sample. In such a procedure, air supplied through the supply nozzle 36 is distributed into the chamber 50, to thus form the interior as an atmosphere of low temperature/moisture and to simultaneously cause the interior of the chamber to be at a higher pressure than that of the exterior.

Therefore, in this manner, by virtue of the protection of the chamber, the sample and its perimeter are under the atmosphere of low temperature/moisture even though they are exposed to the rising operation of the supply nozzle 36, and respective components within the chamber 50 are prevented from the frost described above. Next, the worker detaches the sample that has completed testing from the test board 20, and then the sample is transferred to the auxiliary chamber 60 through the first door 62.

In the above-mentioned test procedure, the worker opens the second door 64 so as to introduce a testing sample into the auxiliary chamber 60, and consecutively executes a series of procedures of mounting the sample on the test board, continuously following the procedure of placing the sample that has formerly undergone testing into the auxiliary chamber 60.

As described above, when a test work for one sample is completed, and the first door 62 is opened, air distributed in the chamber 50 flows into the auxiliary chamber 60 through the opened first door 62. Then, external air having relatively higher moisture remaining within the auxiliary chamber 60 is prevented from flowing into the chamber 50 by the relatively higher pressure of air of the desired low temperature desired moisture flowing within the auxiliary chamber 60. Further, the moisture air of the auxiliary chamber 60 does not flow to the test board 20 and any flow of the moisture air is cut off by reacting with the air of the low temperature/moisture contained in the chamber 50.

Also, when air of low temperature/moisture supplied to the chamber 50 has a pressure that is over a predetermined threshold, the air is discharged through the check valve 54 equipped at a sidewall of the chamber 50, to thus maintain the pressure state of the chamber to a constant level.

As afore-mentioned, in accordance with the present invention, a sample such as an IC, etc. entered for the purpose of a test execution under an environment of very low temperature, exists in a space where low temperature/moisture is maintained. Therefore, under the environment of continuously very low temperature, an exchange of samples for a test is continuously performed. Accordingly, a time taken in exchanging the samples for the test is shortened. The sample and respective test components electrically connected with the sample can be prevented from being damaged and broken through maintenance of low moisture and prevention of the formation of frost.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. An integrated circuit test system comprising:
 a test chamber, a portion of which is adapted to interface with a tester having a circuit panel, the test chamber including a hole through which a supply nozzle can be lowered and raised to and from the circuit panel, the test chamber further comprising an elastic pipe between the hole and a portion of the supply nozzle and positioned within the chamber, the elastic pipe elastically deforming with movement in the supply nozzle, and maintaining a seal between the test chamber and the supply nozzle;
 an auxiliary chamber adjacent the test chamber, the auxiliary chamber including a first door between the auxiliary chamber and the test chamber, the auxiliary chamber further including a second door between the auxiliary chamber and an external region, the auxiliary chamber for receiving a sample prior to and following a test; and
 a transfer unit in the chamber, for transferring the sample between the test chamber and the auxiliary chamber through the first door.

2. The system of claim 1, wherein said transfer unit comprises gloves inserted into a wall of the test chamber to allow for manual manipulation of the sample between the test chamber and the auxiliary chamber.

3. The system of claim 1, wherein said transfer unit comprises a transfer robot installed in the chamber, for transferring the sample between the test chamber and the auxiliary chamber in response to an applied control signal.

4. The system of claim 1, wherein the test chamber further includes a check valve on a wall thereof for discharging air from the test chamber interior to an external region.

5. The system of claim 1, wherein said chamber is made at least partially of a transparent material to allow for external observation of a test conducted therein.

* * * * *